(12) United States Patent
Laghi et al.

(10) Patent No.: US 10,267,869 B2
(45) Date of Patent: Apr. 23, 2019

(54) MEMS TRIAXIAL MAGNETIC SENSOR WITH IMPROVED CONFIGURATION

(71) Applicant: STMICROELECTRONICS S.R.L., Agrate Brianza (IT)

(72) Inventors: Giacomo Laghi, Ravenna (IT); Giacomo Langfelder, Milan (IT); Gabriele Gattere, Castronno (IT); Alessandro Tocchio, Milan (IT); Dario Paci, Sedriano (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/638,204

(22) Filed: Jun. 29, 2017

(65) Prior Publication Data

US 2018/0188336 A1    Jul. 5, 2018

(30) Foreign Application Priority Data

Dec. 29, 2016  (IT) .......................... 102016000132408

(51) Int. Cl.
*G01R 33/02* (2006.01)
*G01R 33/028* (2006.01)
*G01R 33/038* (2006.01)

(52) U.S. Cl.
CPC ..... *G01R 33/0206* (2013.01); *G01R 33/0286* (2013.01); *G01R 33/038* (2013.01)

(58) Field of Classification Search
CPC .................................................. G01R 33/038
See application file for complete search history.

(56) References Cited

U.S. PATENT DOCUMENTS

| 2010/0295546 | A1 | 11/2010 | Walther et al. |
| 2011/0140693 | A1* | 6/2011 | Baldo ................ G01R 33/0005 324/244 |
| 2013/0002244 | A1 | 1/2013 | Quevy |
| 2013/0127455 | A1 | 5/2013 | Ettelt et al. |

(Continued)

OTHER PUBLICATIONS

Kyynäräinen, J. et al., "A 3D micromechanical compass," Sensors and Actuators 142(A):561-568, 2008.

(Continued)

*Primary Examiner* — Clayton E. LaBalle
*Assistant Examiner* — Jas A Sanghera
(74) *Attorney, Agent, or Firm* — Seed IP Law Group LLP

(57) ABSTRACT

A MEMS triaxial magnetic sensor device includes a sensing structure having: a substrate; an outer frame, which internally defines a window and is elastically coupled to first anchorages fixed with respect to the substrate by first elastic elements; a mobile structure arranged in the window, suspended above the substrate, which is elastically coupled to the outer frame by second elastic elements and carries a conductive path for flow of an electric current; and an elastic arrangement operatively coupled to the mobile structure. The mobile structure performs, due to the first and second elastic elements and the arrangement of elastic elements, first, second, and third sensing movements in response to Lorentz forces from first, second, and third magnetic-field components, respectively. The first, second, and third sensing movements are distinct and decoupled from one another.

21 Claims, 11 Drawing Sheets

(56) References Cited

U.S. PATENT DOCUMENTS

2015/0035526 A1 2/2015 Langfelder et al.
2016/0139173 A1 5/2016 El-Gamal et al.

OTHER PUBLICATIONS

Langfelder, G. et al., "Off-Resonance Low-Pressure Operation of Lorentz Force MEMS Magnetometers," IEEE Transactions on Industrial Electronics 61(12):7124-7130, Dec. 2014.
Li, M. et al., "Three-Axis Lorentz-Force Magnetic Sensor for Electronic Compass Applications," Journal of Microelectromechanical Systems 21(4):1002-1010, Aug. 2012.
Li, M. et al., "Extended Bandwidth Lorentz Force Magnetometer Based on Quadrature Frequency Modulation," Journal of Microelectromechanical Systems 24(2):333-342, Apr. 2015.
Rouf, V. T. et al., "Area-Efficient Three Axis MEMS Lorentz Force Magnetometer," IEEE Sensors Journal 13(11):4474-4481, Nov. 2013.
Laghi et al., "100 μA, 320 nT/√Hz, 3-Axis Lorentz Force MEMS Magnetometer," *18th International Conference on Solid-State Sensors, Actuators and Microsystems (Transducers)*, Anchorage, Alaska, Jun. 21-25, 2015, pp. 803-806.

\* cited by examiner

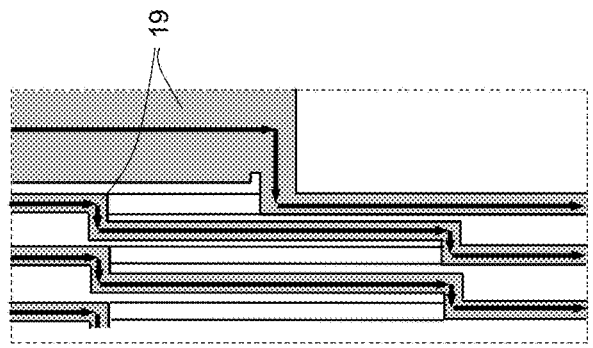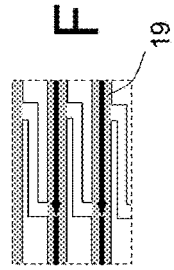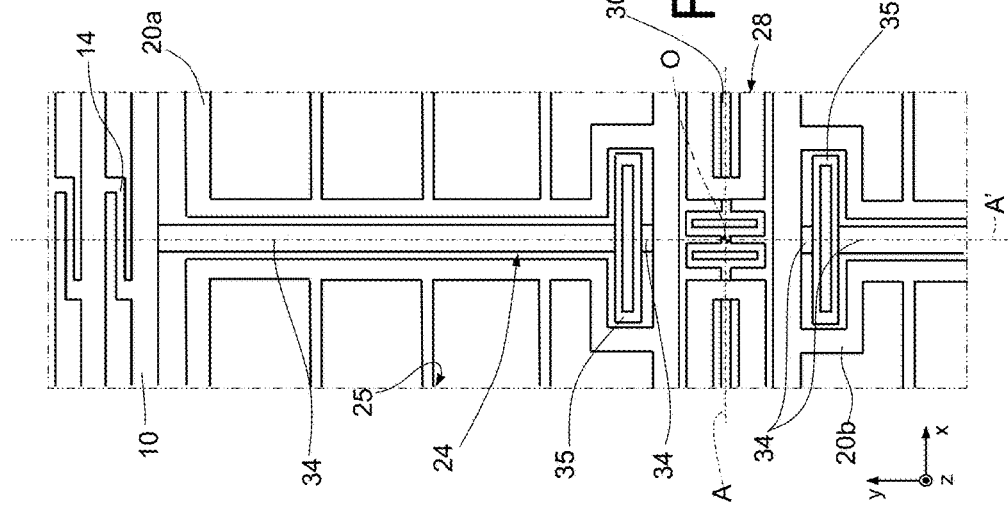

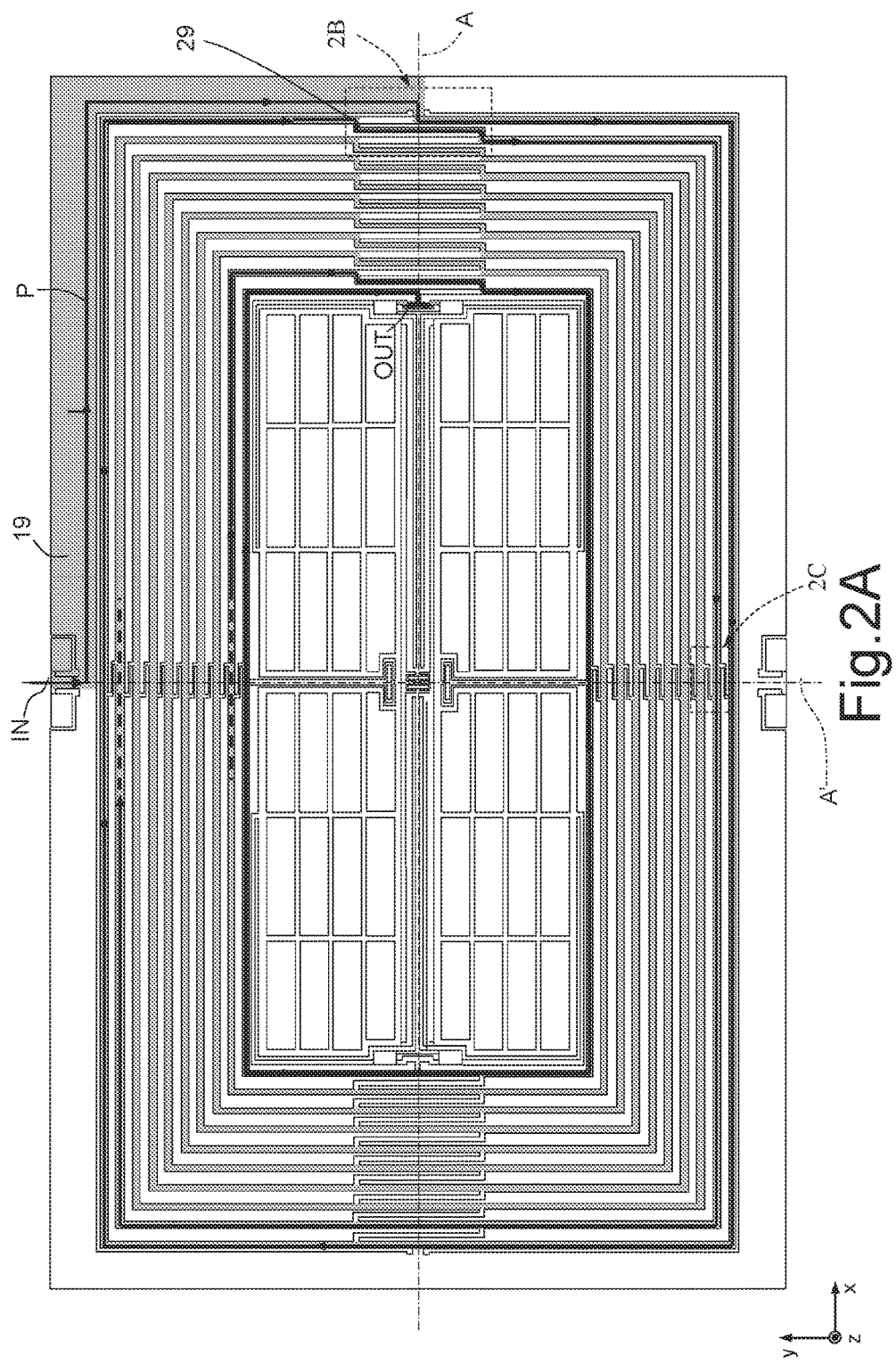

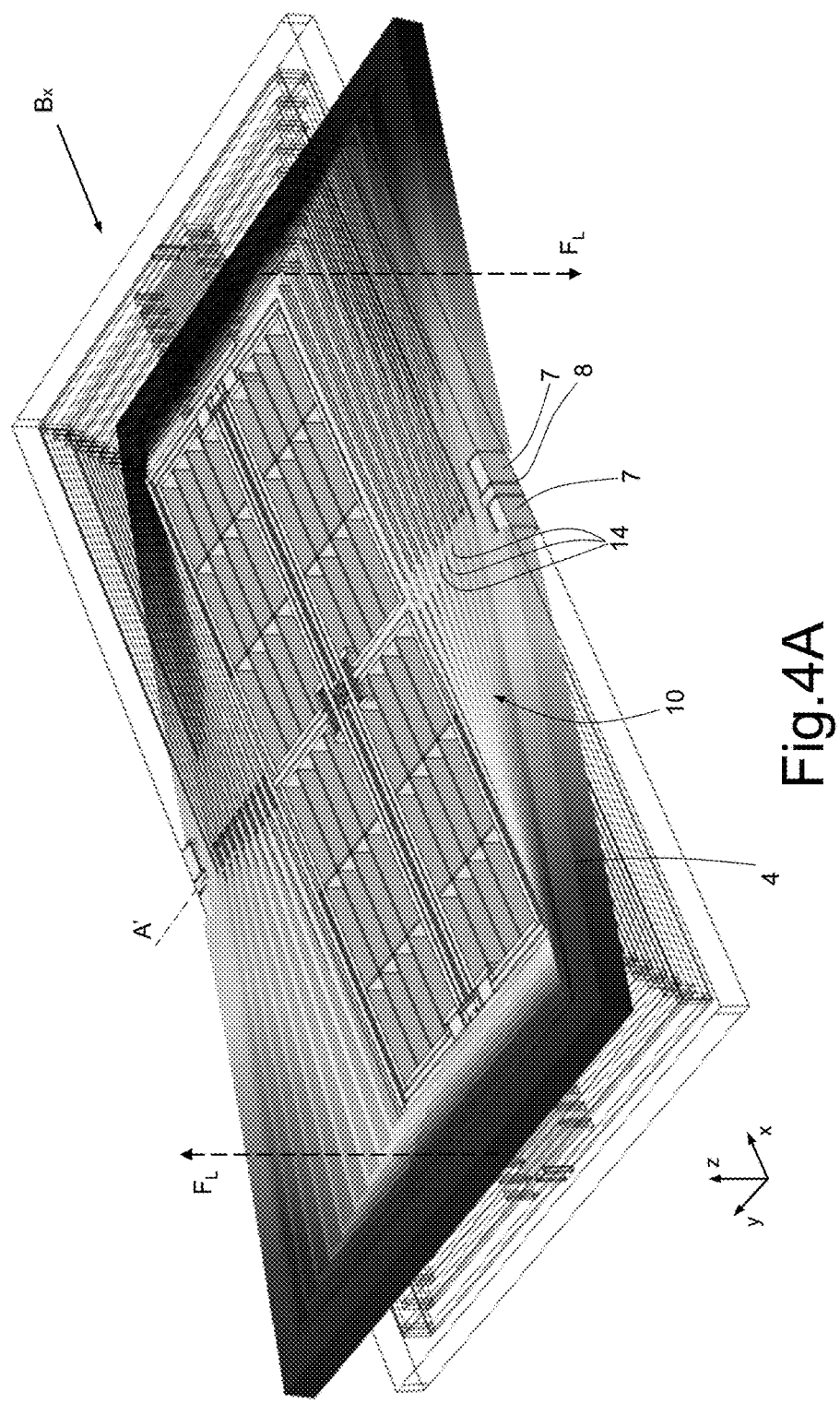

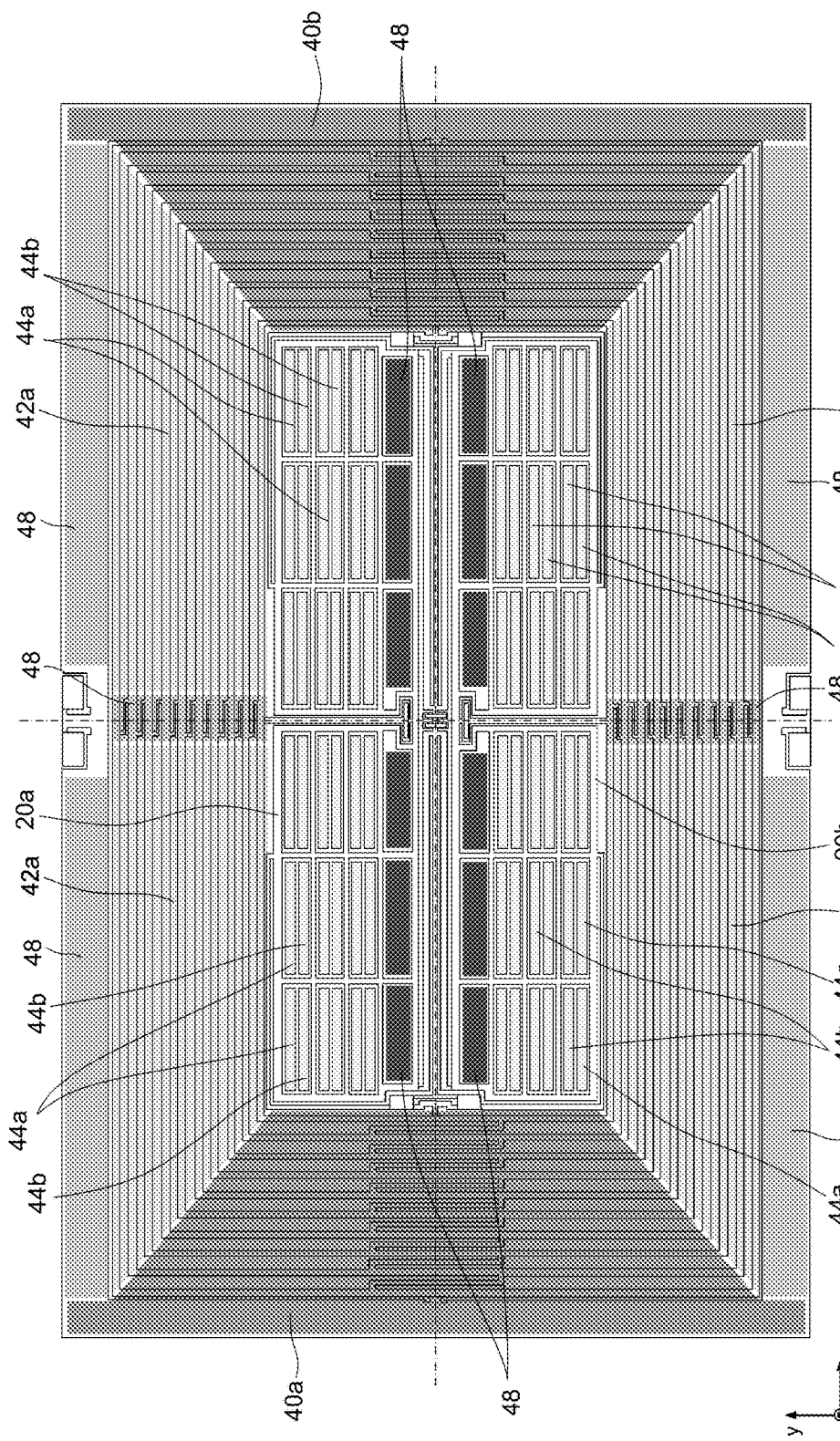

MEMS TRIAXIAL MAGNETIC SENSOR WITH IMPROVED CONFIGURATION

BACKGROUND

Technical Field

The present disclosure relates to a MEMS triaxial magnetic sensor with improved configuration.

Description of the Related Art

As it is known, current micromachining techniques enable manufacturing of MEMS (Micro-Electro-Mechanical Systems) starting from layers of semiconductor material, which have been deposited (for example, a layer of polycrystalline silicon) or grown (for example, an epitaxial layer) on sacrificial layers, which are removed via chemical etching. For example, inertial sensors, accelerometers, and gyroscopes, made with this technology are today widely used, for example, in the automotive field, in inertial navigation, in the field of portable devices, or in the medical field.

In particular, MEMS magnetic sensors (also defined as "magnetometers") are known, which exploit the Lorentz force to obtain magnetic field measurements.

In these sensors, an electric current is made to circulate through a mobile portion of a corresponding sensing structure, appropriately suspended above a substrate, to which it is coupled by elastic elements. In the presence of a magnetic field to be detected, as a result of the Lorentz force, a movement of the mobile portion is generated; the extent of this movement, which may for example be detected with the capacitive technique, is indicative of the magnetic field value.

The sensing structure of the sensor does not comprise in this case any magnetic material and may be manufactured by ordinary semiconductor micromachining techniques.

In particular, in several applications, a device may detect magnetic fields acting in a number of sensing directions, for example in three sensing directions corresponding to three orthogonal Cartesian axes.

For example in so-called "sensor fusion" applications, for instance, for compasses or navigation devices, sensor devices may include, in an integrated and combined manner, accelerometers, gyroscopes, and triaxial magnetometers, for a total of nine sensing axes, and a corresponding electronic circuit (so-called ASIC—Application-Specific Integrated Circuit), for detecting and reading the detected signals of acceleration, angular velocity, and magnetic field.

From this evidently derives a desire to reduce as far as possible the size and consumption, with the consequent desire to reduce the dimensions of the aforesaid sensors, and in particular of the MEMS triaxial magnetic sensor.

Currently, the majority of MEMS triaxial magnetic sensors include a number of sensing structures, typically one sensing structure for each magnetic-field sensing axis. This solution has the advantage of enabling a design of each sensing structure (and of the coupled sensing electrodes and anchorage and suspension structures) that is targeted and specific for the detection requirements in the respective sensing direction. However, this solution does not enable reduction of the area occupation and entails in general high costs, power consumption, and manufacturing complexity.

Some known solutions for providing MEMS triaxial magnetic sensors are described, for example, in:

J. Kyynarainen, J. Saarilahti, H. Kattelus, A. Karkkainen, T. Meinander, A. Oja, P. Pekko, H. Seppa, M. Suhonen, H. Kuisma, S. Ruotsalainen, M. Tilli, "A 3D Micromechanical Compass", Sens. Actuators A, Phys., 142, 2, 561-568, April 2008;

G. Langfelder, G. Laghi, P. Minotti, A. Tocchio, A. Longoni, "Off-Resonance Low-Pressure Operation of Lorentz Force MEMS Magnetometers", IEEE Transactions on Industrial Electronics, Vol. 61, No. 12, December 2014, 7124-7130;

M. Li, S. Sonmezoglu, D. A. Horsley, "Extended Bandwidth Lorentz Force Magnetometer Based on Quadrature Frequency Modulation", Journal of Microelectromechanical Systems, 24, 2, pp. 333-342, April 2015.

A further known solution is described in US patent application 2015/0035526 A1, in the name of the present Applicant.

The above known solutions generally have a large occupation of area in the integrated implementation and a high consumption of electric power, and do not have optimized electrical performances (for example, as regards sensitivity, offset, and rejection of disturbances generated by accelerations or vibrations of the environment in which the sensor device is operated).

BRIEF SUMMARY

At least one embodiment of the present disclosure solves, at least in part, the problems highlighted previously, in order to provide an improved configuration for a MEMS triaxial magnetic sensor, in particular in terms of area occupation, consumptions of electrical energy, and sensing performance.

According to the present disclosure, a MEMS triaxial magnetic sensor is thus provided. At least one embodiment is a MEMS triaxial magnetic sensor device that includes a sensing structure having:

a substrate;

first anchorages fixed with respect to the substrate;

first elastic elements;

an outer frame internally defining a window and elastically coupled to the first anchorages by the first elastic elements;

second elastic elements;

a mobile structure, arranged in the window suspended above the substrate, elastically coupled to the outer frame by the second elastic elements, and carrying a conductive path for flow of an electric current; and an elastic arrangement, within the window, operatively coupled to the mobile structure. The mobile structure is configured to perform, due to the first and second elastic elements and of the elastic arrangement:

a first sensing movement in response to Lorentz forces originating from a first magnetic-field component;

a second sensing movement in response to Lorentz forces originating from a second magnetic-field component; and a third sensing movement in response to Lorentz forces originating from a third magnetic-field component, in the presence of the electric current in the conductive path; wherein the first, second, and third sensing movements are distinct and decoupled from one another.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 1B and 1C show enlarged portions of the sensing structure of FIG. 1A;

FIG. 2A is a schematic top plan view of a conductive path for electric current defined in the sensing structure of FIG. 1A;

FIGS. 2B and 2C show enlarged details of the conductive path of FIG. 2A;

FIGS. 4A-4C schematically show sensing movements of the sensing structure of FIG. 1, in response to respective axial components of a detected magnetic field;

FIG. 5 is a schematic top plan view of an arrangement of sensing electrodes in the sensing structure of FIG. 1;

DETAILED DESCRIPTION

Figure 1A:
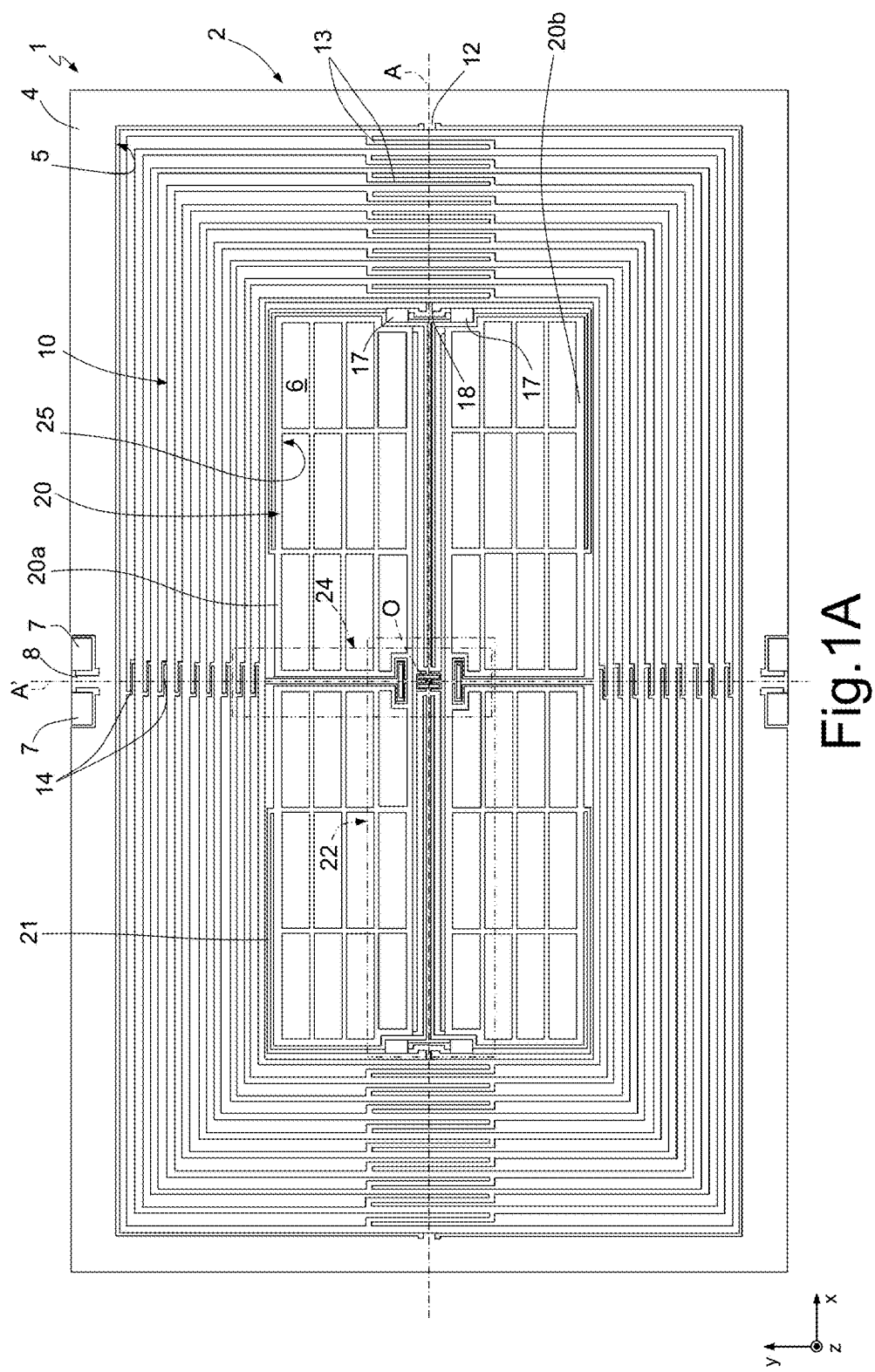
FIG. 1A is a schematic top plan view of a sensing structure of a MEMS triaxial magnetic sensor, according to the present solution.

With initial reference to FIG. 1A, a MEMS triaxial magnetic sensor 1, according to one embodiment of the present solution, comprises a single monolithic sensing structure 2, i.e., one that is itself able to detect magnetic fields along sensing axes x, y, z of a set of three orthogonal axes. The sensing structure 2 has, in the example, a rectangular conformation in a horizontal plane xy, defined by a first horizontal axis x and a second horizontal axis y, and constituting a plane of main extension for the sensing structure 2 (which has a substantially negligible, or in any case much smaller, extension along a vertical axis z, which defines, with the horizontal axes x, y, the aforesaid set of three orthogonal axes).

The sensing structure 2 is generally made of silicon, for example polycrystalline silicon, and is made, for instance, by successive steps of: formation of a sacrificial layer over a substrate; formation of a sensor layer over the sacrificial layer; definition of the sensor layer for formation of mobile masses and elastic and anchorage elements; and removal of the sacrificial layer, for release of the sensor layer from the substrate and its suspended arrangement above the same substrate.

The sensing structure 2 has a first median axis, or axis of symmetry, A, parallel to the first horizontal axis x, and a second median axis, or axis of symmetry, A', parallel to the second horizontal axis y. The first and second axes of symmetry A, A' cross at a geometrical center O of the sensing structure 2 in the horizontal plane xy.

The sensing structure 2 comprises an outer decoupling frame 4, of semiconductor material, for example polysilicon, in particular having the function of decoupling the rotational, or torsional, modes (as described in detail hereinafter), having a rectangular-frame conformation in the horizontal plane xy and defining therewithin a main window 5 (having a rectangular conformation in the aforesaid horizontal plane xy).

The outer decoupling frame 4 is suspended above a substrate 6 and is coupled, at the second axis of symmetry A', to a first pair and a second pair of external anchorages 7, fixed with respect to the same substrate 6. The external anchorages 7 are, for example, constituted by respective columns that extend vertically, along the vertical axis z, starting from the aforesaid substrate 6, and are arranged, in pairs, on opposite sides of the second axis of symmetry A', aligned along the first axis of symmetry A.

In particular, the outer decoupling frame 4 is coupled to the aforesaid external anchorages 7 by first elastic elements 8, of a torsional type, which are designed to enable, as described hereinafter, rotation of the same outer decoupling frame about the second axis of symmetry A'.

The sensing structure 2 further comprises, housed within the window 5, a mobile structure 10, also made of semiconductor material, in the example polysilicon, and constituted by a plurality of nested frames, which share the aforesaid geometrical center O and each of which has a substantially rectangular conformation in the horizontal plane xy.

The mobile structure 10 is elastically coupled to the outer decoupling frame 4, by second elastic elements 12, of a torsional type, which are arranged at the first axis of symmetry A. The elastic elements 12 couple the outermost frame of the nested frames of the mobile structure 10 to the aforesaid outer decoupling frame 4 and are designed to enable, as described hereinafter, rotation of the mobile structure 10 about the first axis of symmetry A.

In particular, short sides, parallel to the second horizontal axis y, of the nested frames of the mobile structure 10 are coupled together, in pairs, by first coupling elements 13, having an S-shaped conformation, arranged along the first axis of symmetry A. Likewise, long sides, parallel to the first horizontal axis x, of the nested frames of the mobile structure 10 are coupled together, in pairs, by second coupling elements 14, which also have an S-shaped conformation and are arranged along the second axis of symmetry A'.

The mobile structure 10 is further elastically coupled, at the first axis of symmetry A, to a first pair and a second pair of internal anchorages 17, which are fixed with respect to the substrate 6, by third elastic elements 18, of a torsional type.

According to a particular aspect of the present solution, a spiral-shaped electrical path P is defined on the mobile structure 10, for the flow of an electric current I.

This electrical path P, highlighted in FIG. 2A, is physically defined by a conductive layer 19 made, for example, of a metal material (such as aluminum), selectively deposited on the mobile structure 10.

Figure 3:
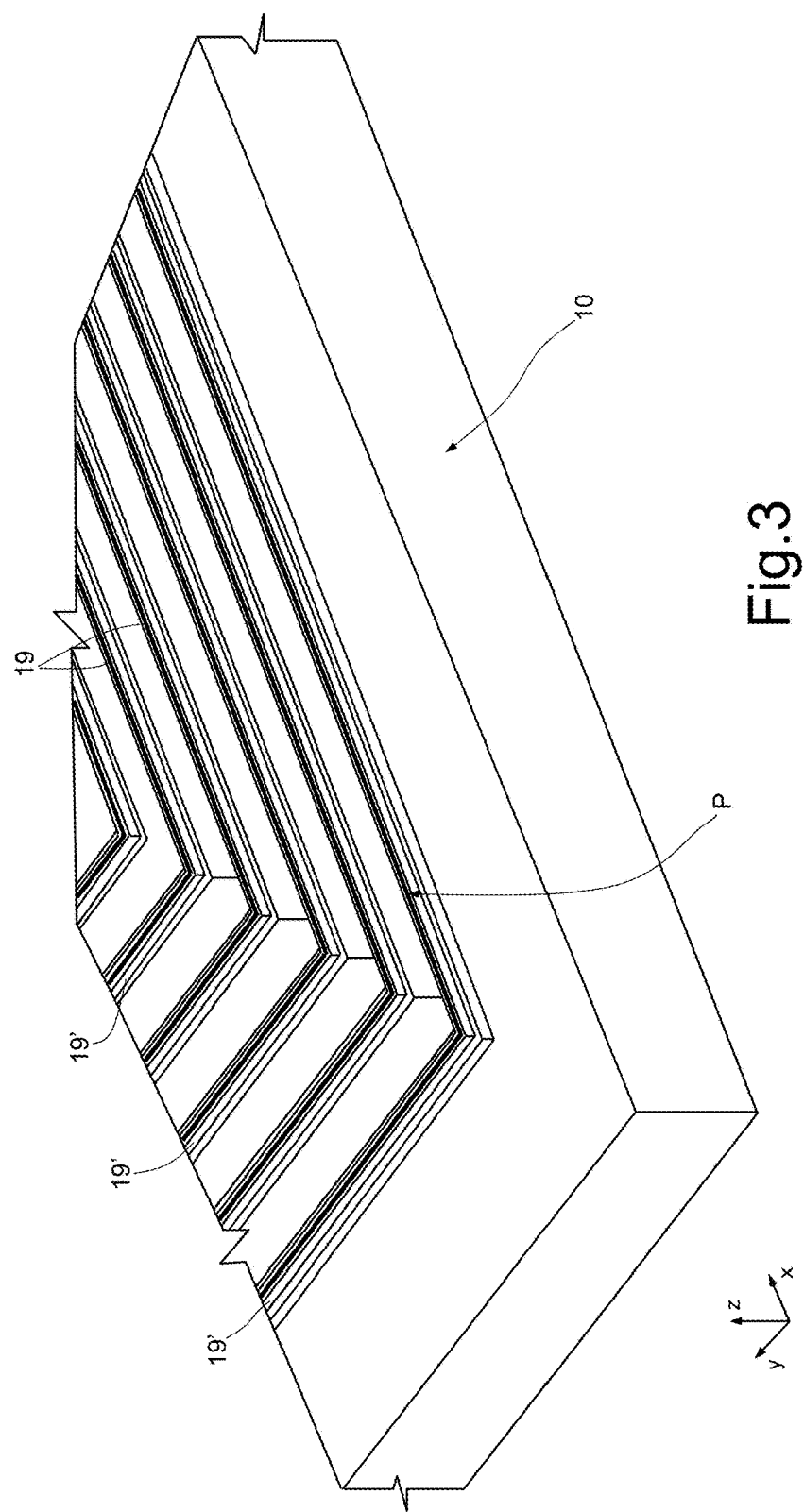
FIG. 3 is a perspective view of an enlarged portion of the conductive path of FIG. 2A.

As shown in the enlarged detail of FIG. 3, between the conductive layer 19 and the material of the mobile structure 10 an insulating layer 19' may conveniently be arranged, made, for example, of silicon carbide (or other suitable dielectric material).

In detail, the aforesaid electrical path P starts on the outer decoupling frame 4, at the first pair of external anchorages 7, and proceeds as a spiral on the mobile structure 10, starting from the outermost frame until it reaches the innermost frame, ending at the first pair of internal anchorages 17.

In particular, and as is also highlighted in FIGS. 2B and 2C, the electrical path P passes from an outer frame to an inner frame of the nested frames of the mobile structure 10 through only one half of just the first coupling elements 13, in the example shown the half on the right with respect to the second axis of symmetry A'.

It should be noted that the particular S-shaped conformation of the first and second coupling elements 13, 14, where the conductive layer 19 is not deposited, prevents, in particular in the case where the aforesaid insulating layer 19' is not present, leakage of current through the mobile structure 10, defining high-resistance portions between the facing sides of the nested frames. In other words, the electric current I remains "confined" along the electrical path P, which constitutes a low-resistance path, encountering elsewhere a high impedance.

It should further be noted that, according to the present solution (as will be on the other hand described in detail hereinafter), the single mobile structure 10 is designed, as a result of the Lorentz force, to perform respective sensing movements in all three sensing directions of the triaxial detection, these movements being distinct and appropriately decoupled from one another.

Figure 1B:
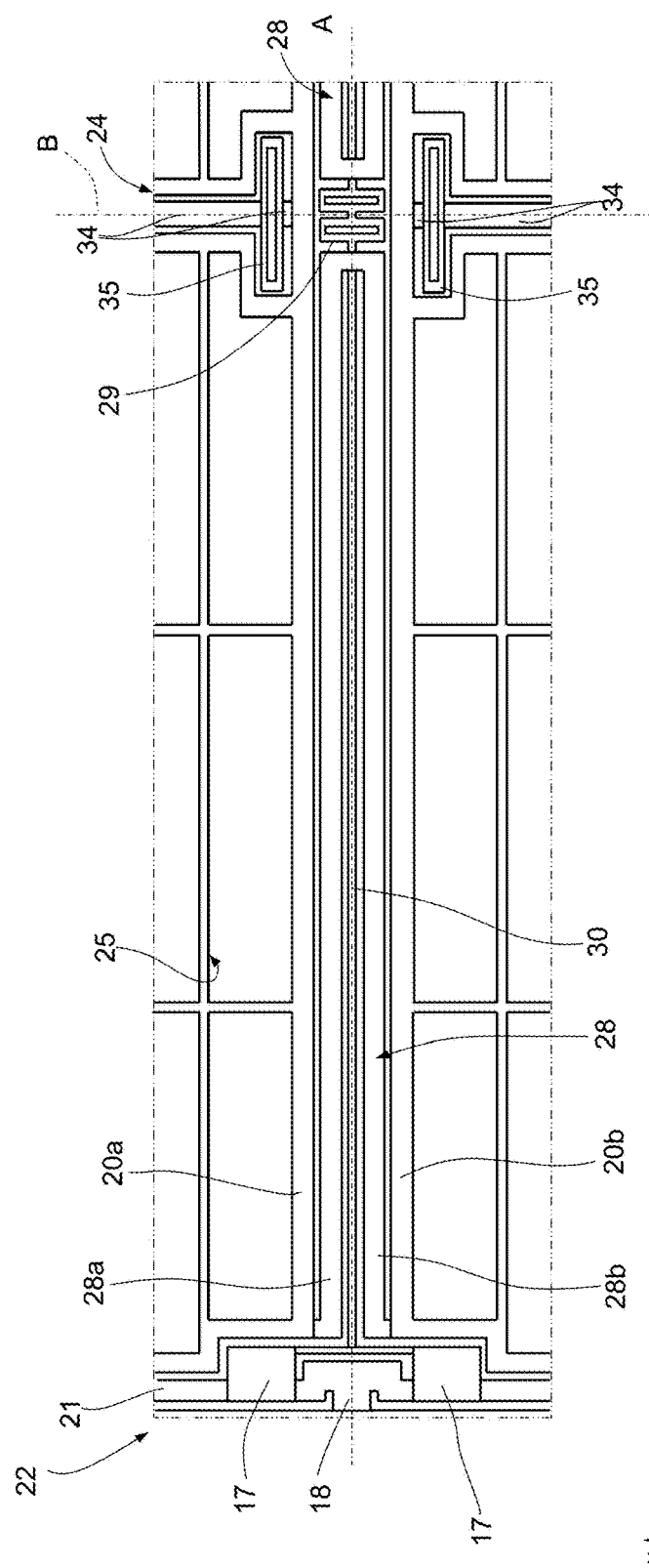

The sensing structure 2 further comprises: an electrode frame 20 with grid conformation, arranged internally with respect to the innermost frame of the mobile structure 10; a first elastic structure 22 (shown in greater detail in the enlargement of FIG. 1B); and a second elastic structure 24 (shown in greater detail in the enlargement of FIG. 1C).

The electrode frame 20 comprises a first half 20a and a second half 20b, arranged on opposite sides with respect to the first axis of symmetry A, each defining a plurality of openings 25, with rectangular conformation. In a way not illustrated herein (and that will be described hereinafter), a respective pair of stator electrodes is arranged within each opening 25, forming with the facing sides of the electrode frame 20 a differential pair of capacitors with plane and parallel faces (the electrode frame 20 thus defines as a whole a mobile electrode of the parallel plate capacitors, once again as will be discussed in detail hereinafter).

A further elastic decoupling element 21 is arranged between the internal anchorages 17 and the electrode frame 20 (in order to prevent spurious modes in the frequency range of interest).

As a whole, the outer decoupling frame 4, the mobile structure 10, and the electrode frame 20 form the so-called "rotor" of the sensing structure 2.

Each half 20a, 20b of the electrode frame 20 is connected to the first elastic structure 22 at the first axis of symmetry A.

In particular, the first elastic structure 22 comprises a first elastic coupling element 28, of the so-called tuning fork type, formed by two halves, centrally coupled by a second elastic coupling element 29.

Each half of the first elastic coupling element 28 has a fork, or diapason, conformation and comprises a respective first arm 28a and a respective second arm 28b, which are symmetrical with respect to the first axis of symmetry A and have a linear extension along the first horizontal axis x, with a first end coupled, respectively, to the first half 20a or to the second half 20b of the electrode frame 20, and second ends joined together. The aforesaid second ends of the arms 28a, 28b of the two halves of the first elastic coupling element 28 are elastically coupled together by the second elastic coupling element 29, at the geometrical center O of the sensing structure 2.

Moreover, the second ends of the arms 28a, 28b of the two halves of the first elastic coupling element 28 are elastically coupled to the internal anchorages 17, by a respective third elastic coupling element 30, extending linearly along the first axis of symmetry A, between the same arms 28a, 28b.

The second elastic structure 24 of the sensing structure 2 is arranged centrally at the second axis of symmetry A', and has the function of elastically decoupling the electrode frame 20 from the mobile structure 10 during at least one of the sensing movements (or modes).

The second elastic structure 24 comprises a first elastic decoupling element 34 and a second elastic decoupling element 35, for each half of the electrode frame 20, symmetrically with respect to the first axis of symmetry A.

The first elastic decoupling element 34 comprises a first portion and a second portion, which have a linear extension along the second axis of symmetry A'. In particular, the first portion extends from the innermost frame of the mobile structure 10 as far as a facing side of the second elastic element 35 (the latter having a rectangular-frame conformation), and the second portion extends from an opposite side (along the second axis of symmetry A') of the aforesaid second elastic element 35 as far as the electrode frame 20.

Figure 4B:
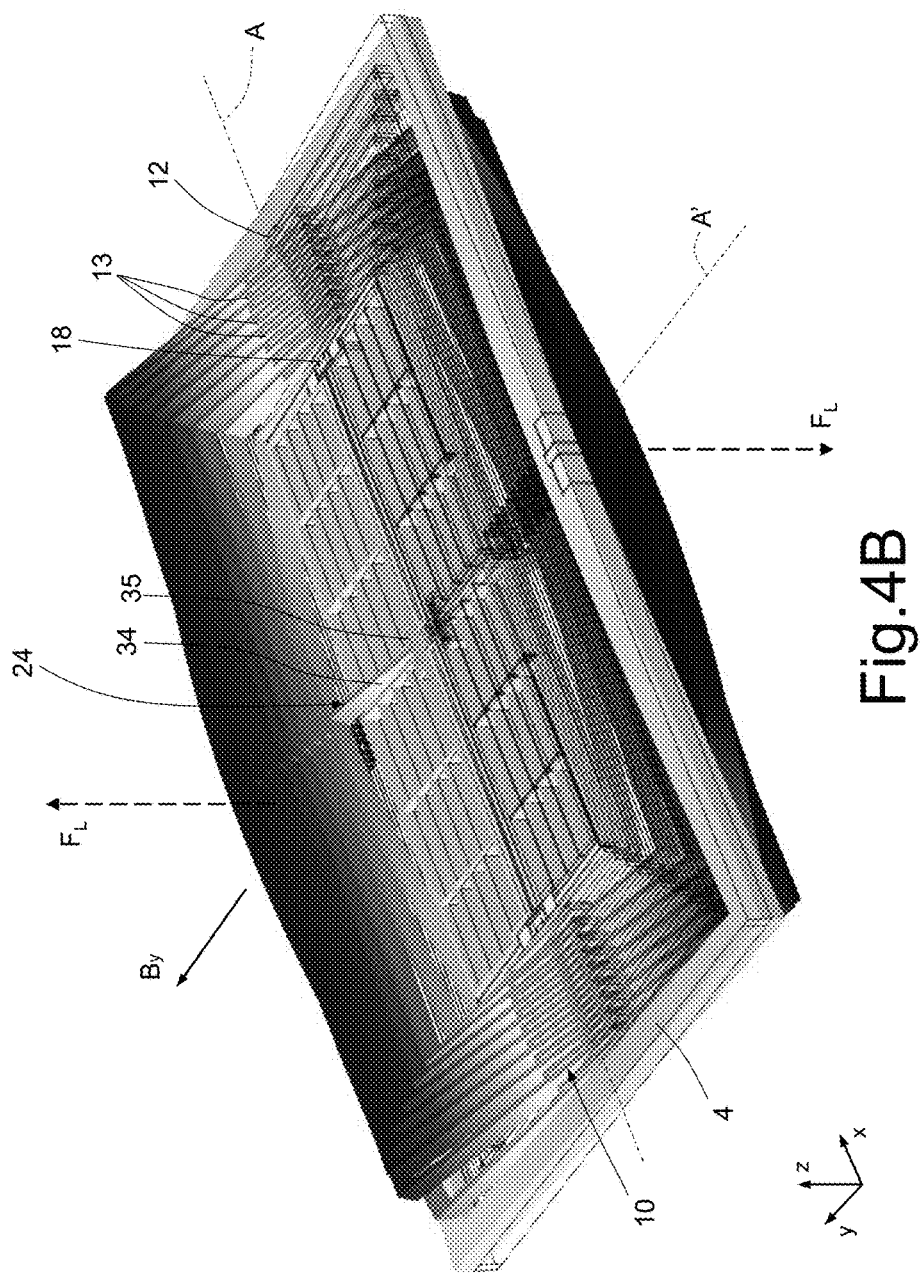
Figure 4C:
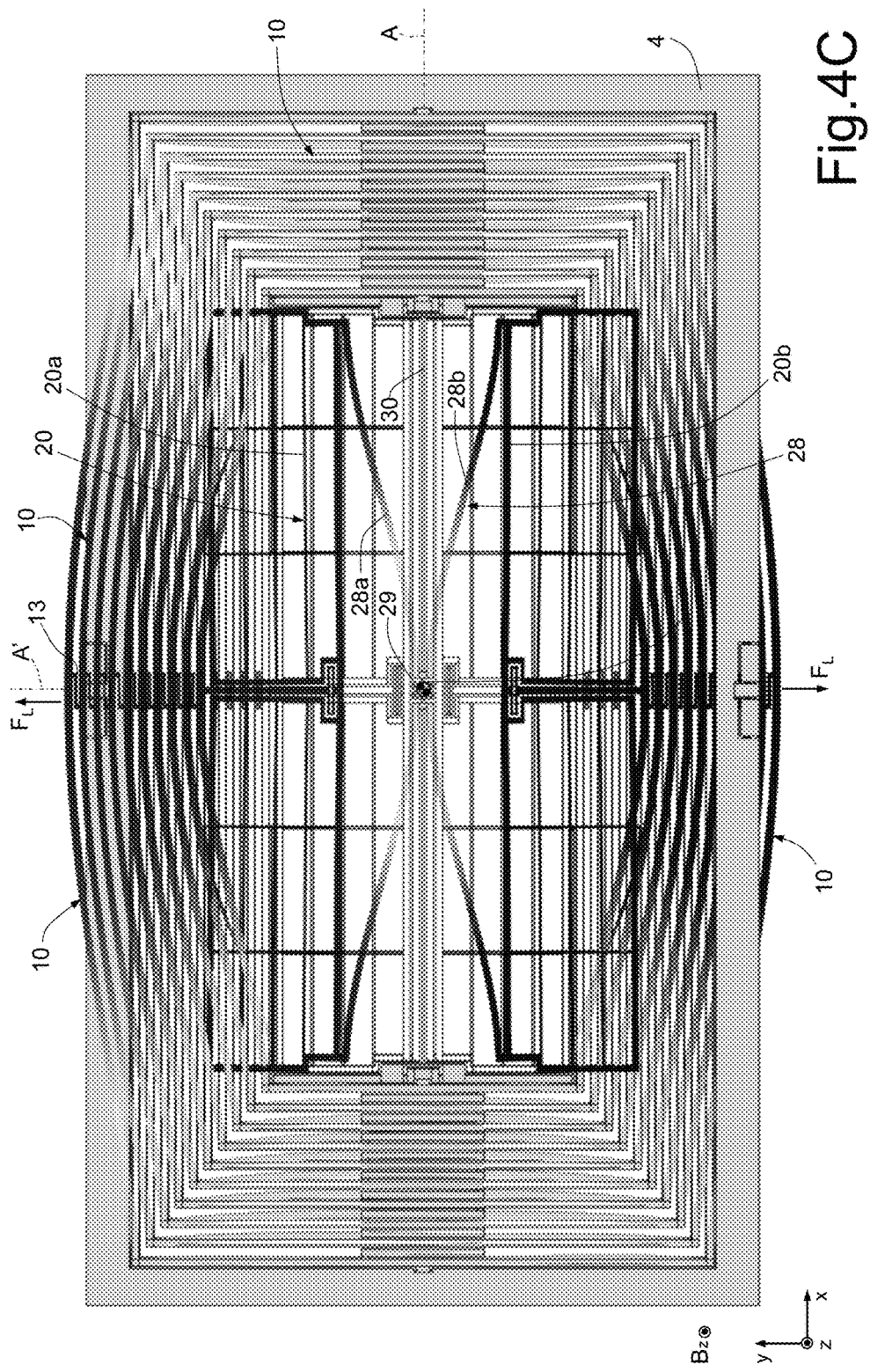

Operation of the sensing structure 2 is now described, for detection of: a first magnetic-field component $B_x$ (see FIG. 4A) directed parallel to the first horizontal axis x; a second magnetic-field component $B_y$ directed parallel to the second horizontal axis y (see FIG. 4B); and a third magnetic-field component $B_z$ directed parallel to the vertical axis z (see FIG. 4C).

The electric current I flowing along the conductive path P determines, in the presence of each magnetic-field component $B_x$, $B_y$, $B_z$, a different movement of the same mobile structure 10, as a result of the Lorentz force $F_L$.

The sensing structure 2 is appropriately configured so that the resonance frequency of the operating modes along the three sensing axes is appropriately positioned close to the frequency at which the electric current I is supplied.

In detail, in the presence of the first magnetic-field component $B_x$, as illustrated schematically in FIG. 4A, Lorentz forces $F_L$ are generated directed along the vertical axis z, in opposite directions in the two halves into which the sensing structure 2 is divided by the second axis of symmetry A', causing a first sensing movement of the mobile structure 10, fixed with respect to the outer decoupling frame 4, being a rotation about the second axis of symmetry A' (it should be noted that the extent of this movement is deliberately exaggerated in the aforesaid FIG. 4A, for greater clarity of illustration).

The elastic elements that mainly determine this first sensing movement (or mode), and the corresponding frequency, are the first elastic elements 8, of a torsional type, and, partially, the second coupling elements 14, having an S-shaped conformation, which couple together the long sides, parallel to the first horizontal axis x, of the nested frames of the mobile structure 10.

In the presence of the second magnetic-field component $B_y$, as illustrated schematically in FIG. 4B, Lorentz forces $F_L$ are again generated directed along the vertical axis z, this time in opposite directions in the two halves into which the sensing structure 2 is divided by the first axis of symmetry A, causing a second sensing movement of the mobile structure 10, this time in a way decoupled from the outer decoupling frame 4, being a rotation about the first axis of symmetry A. During this movement, the electrode frame 20 remains substantially still, parallel to the horizontal plane xy.

The elastic elements that mainly determine the second sensing movement, and the corresponding frequency, are the second and third elastic elements 12, 18, of a torsional type, and, partially, the first coupling elements 13, having an S-shaped conformation, which couple together the short sides, parallel to the second horizontal axis y, of the nested frames of the mobile structure 10, and also the second elastic structure 24 (in particular, the corresponding elastic decoupling elements 34, 35).

During the second sensing movement, the second elastic structure 24, in fact, elastically decouples the movement of the mobile structure 10 from the electrode frame 20, which consequently remains substantially still, parallel to the horizontal plane xy.

In greater detail, the first elastic decoupling element 34 basically operates as a double lever that enables rotation of the mobile structure 10 about the first axis of symmetry A in the presence of the second magnetic-field component $B_y$, along the second horizontal axis y.

The second elastic decoupling element 35 operates so that the aforesaid first elastic decoupling element 34 may act in the presence of the second magnetic-field component $B_y$ (movement illustrated in the aforesaid FIG. 4B), allowing rotation of the mobile structure 10 without, instead, enabling rotation of the electrode frame 20, which remains substantially still.

In the presence of the third magnetic-field component $B_z$, as illustrated schematically in FIG. 4C, Lorentz forces $F_L$ are generated directed this time along the second horizontal axis y, in opposite directions in the two halves into which the sensing structure 2 is divided by the first axis of symmetry A, causing a third sensing movement of the mobile structure 10, once again in a way decoupled from the outer decoupling frame 4, being a deformation by translation along the second horizontal axis y. The electrode frame 20 is, in this case, fixedly coupled to the mobile structure 10 in the aforesaid third sensing movement, thus undergoing the same translation.

The elastic elements that mainly determine this third sensing movement, and the corresponding frequency, are: the arms 28a, 28b of the first elastic coupling element 28, of a tuning-fork type, of the first elastic structure 22, which undergo deformation in opposite directions, opening/closing the fork (according to the direction of the magnetic field) in the direction of the second horizontal axis y; and also the long sides of the nested frames of the mobile structure 10, which undergo a deformation towards the outside/inside in the same direction along the second horizontal axis y.

In greater detail, the first elastic coupling element 28 consequently has the role of coupling the two halves (top half and bottom half) 20a, 20b of the electrode frame 20, guaranteeing a single resonance frequency in phase opposition for the two halves 20a, 20b, which undergo deformation in opposite directions along the second horizontal axis y during the third sensing movement of the sensing structure 2. The same elastic coupling element 28 shifts the frequency of the in-phase displacement mode (which is undesired) along the same second horizontal axis y away from that of the phase-opposition mode (which is desired).

The second elastic coupling element 29 weakly couples the two halves of the first elastic coupling element 28, in particular preventing a mode that might cause their internal ends to rise along the vertical axis z. The same second elastic coupling element 29 leaves, however, the two halves independent, for modes in the horizontal plane xy, basically shifting to high frequencies (undesired) spurious modes, in particular ones directed out of the horizontal plane xy.

The third elastic coupling element 30, in a substantially similar way, prevents the internal ends of the two halves of the first elastic coupling element 28 from easily moving along the vertical axis z, preventing spurious modes of the same first elastic coupling element 28 at low frequencies.

As illustrated in FIG. 5, the sensing structure 2 further comprises a plurality of fixed (or stator) electrodes, for detecting, by capacitive coupling with the mobile structure 10 or the electrode frame 20, the extent of the aforesaid sensing movements.

As shown schematically in the same FIG. 5, the stator electrodes comprise:

a pair of first stator electrodes 40a, 40b, arranged on the substrate 6, underneath the mobile structure 10, on opposite sides of the second axis of symmetry A', symmetrically with respect to the same second axis of symmetry A';

at least one pair of second stator electrodes 42a, 42b, arranged on the substrate 6, underneath the mobile structure 10, on opposite sides of the first axis of symmetry A, symmetrically with respect to the same first axis of symmetry A; and a first plurality and a second plurality of third stator electrodes 44a, 44b, arranged in pairs in each of the openings 25 defined by the first and second halves 20a, 20b, respectively, of the electrode frame 20, the electrodes of the first and second pluralities being electrically connected together.

In particular, the first stator electrodes 40a, 40b form, with the mobile structure 10, a first pair of differential-detection capacitors, the capacitance of which is variable as a function of the first magnetic-field component $B_x$ that is to be detected; the second stator electrodes 42a, 42b form, with the same mobile structure 10, a second pair of differential-detection capacitors, the capacitance of which is variable as a function of the second magnetic-field component $B_y$ that is to be detected; and the third stator electrodes 44a, 44b form as a whole, with the electrode frame 20, a third pair of differential-detection capacitors, the capacitance of which is variable as a function of the third magnetic-field component $B_z$ that is to be detected.

The configuration of the sensing structure 2 causes the aforesaid pairs of sensing capacitors to undergo a differential capacitive variation for the mode corresponding to the respective component of the magnetic field to be detected, while there is substantially no capacitive difference for the modes corresponding to the other directions of the magnetic field (either because there does not occur any movement between the respective electrodes, or because the movement gives rise to a common-mode variation, which is cancelled out as a result of differential detection).

Detection along each sensing axis is thus decoupled from detection along the other sensing axes and is also not affected by any possible spurious movements or other types of common-mode disturbance.

In particular, advantageously, also movements due to accelerations along the three sensing axes determine substantially zero capacitive variations for the differential pairs (once again, either because they cause a very small movement in so far as the corresponding modes have been shifted to high frequency via the elastic structures described, or because they bring about a common-mode movement for the electrodes).

As shown schematically once again in FIG. 5, purposely provided tuning electrodes 48 may moreover be envisaged, for each sensing axis, having the purpose of slightly modifying the resonance frequencies of the modes (via the electrostatic effect), so as to obtain exactly the desired values, as per design, even in the presence of minor process fluctuations that cause the actual frequencies to slightly differ from the design values. The same tuning electrodes 48 may also have the additional purpose of reducing mechanical offset of the sensing structure 2.

The advantages of the MEMS triaxial magnetic sensor are clear from the foregoing description.

In any case, it is again underlined that the solution described enables a considerable reduction in the area occupied and in the electrical consumption, in particular by virtue of the use of a single mobile monolithic structure 10 for detecting the magnetic field along the three axes of the set of Cartesian axes and of the associated mode-decoupling structures.

The configuration of the sensing structure 2 is advantageously such that the resonance frequencies of the (desired) sensing modes along the three sensing axes is close to the frequency of the sensing current I, and further, simultaneously, all the other (undesired) spurious modes are located far away from the desired frequency range.

For example, it is possible to obtain structures having overall dimensions in the horizontal plane of less than 1000 µm×500 µm, with a reduction of area even of one order of magnitude as compared to known sensors operating on the basis of the Lorentz force, maintaining the electrical performance (for example, in terms of sensitivity and noise) unaltered.

Furthermore, the solution described allows to obtain an increase of sensitivity in detecting the magnetic-field components $B_x$, $B_y$, $B_z$, with a consequent improvement of performance in terms of noise, and also a minimization of the offset.

Use of an electrical-insulation layer 19' arranged between the conductive layer 19 (which defines the conductive path P) and the mobile structure 10 further affords specific advantages, among which: preventing undesired leakage-current paths in the silicon of the mobile structure 10; enabling biasing of the mobile structure 10 at higher DC voltages; setting the voltage of the mobile structure 10 at an appropriate value, which minimizes the offset and consequent parasitic currents through the sensing electrodes; and enabling a number of nested current loops in a same geometry.

In particular, the use of DC biasing voltages of a high value for the mobile structure 10 (thanks to the electrical insulation with respect to the conductive layer 19) simultaneously enables increase of the value of the detected quantity starting from the capacitive variation, and minimization of the offsets induced by undesired AC voltages.

Figure 6:
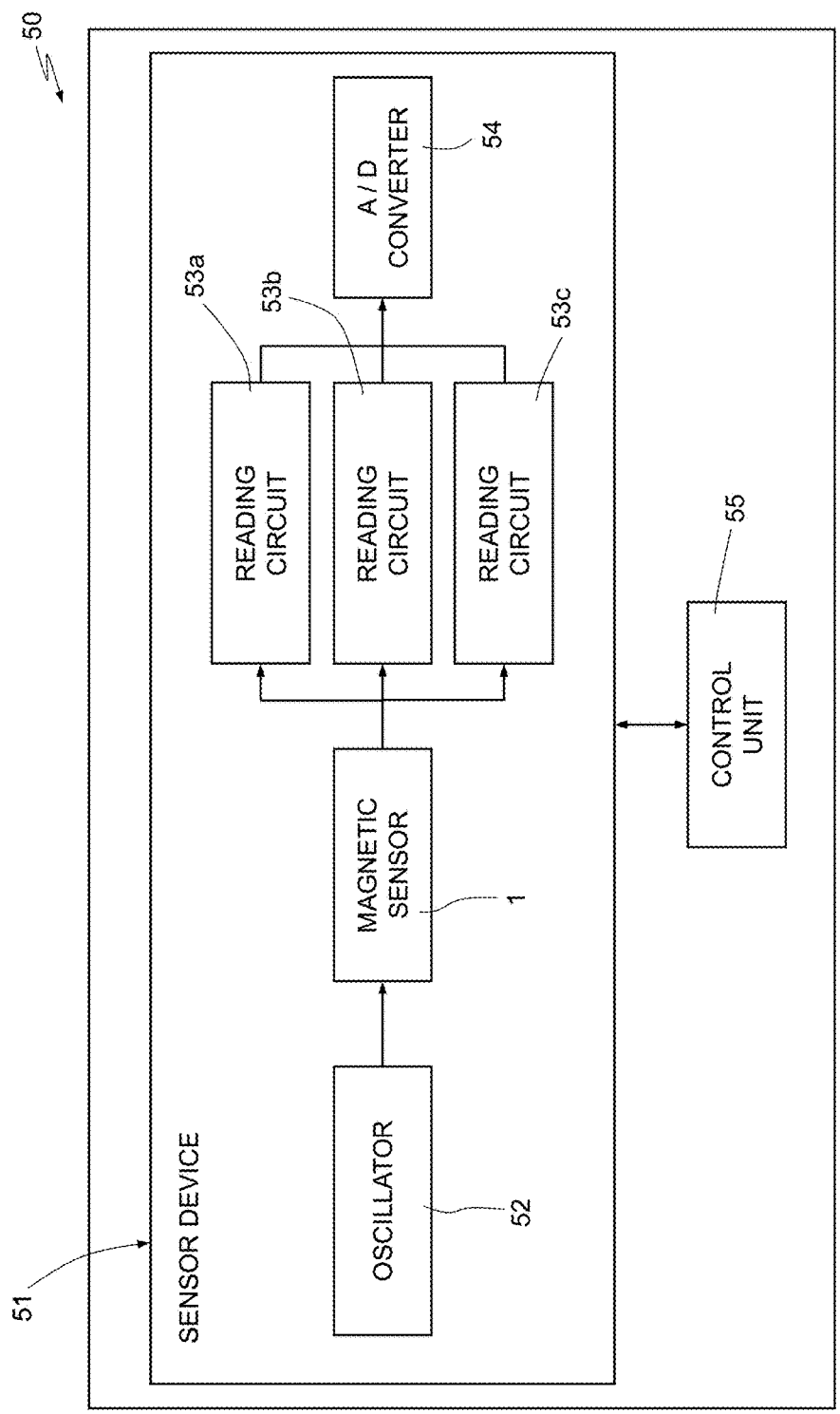
FIG. 6 shows a general block diagram of an electronic apparatus incorporating the MEMS triaxial magnetic sensor, according to one aspect of the present solution.

Basically, the aforesaid characteristics make the MEMS triaxial magnetic sensor 1 particularly indicated for integration in an electronic apparatus 50, as shown schematically in FIG. 6, which may be used in a plurality of electronic systems, for example in navigation systems, in automotive systems or in systems of a portable type, such as: a PDA (Personal Digital Assistant); a portable computer; a mobile phone; a digital audio player; and a photographic or video camera. The electronic apparatus 50 is generally able to process, store, transmit, and receive signals and information.

The electronic apparatus 50 comprises, in particular, a sensor device 51, which includes: the MEMS triaxial magnetic sensor 1; an oscillator circuit 52, operatively coupled to the MEMS triaxial magnetic sensor 1, for supplying a reference-frequency signal; a capacitive reading circuit 53a, 53b, 53c for each of the sensing axes, configured to receive an electrical quantity indicating the capacitive variation of the respective sensing capacitor and process the same quantity (for example, via amplification and filtering operations); and an analog-to-digital converter circuit 54, configured for digital conversion of the analog sensing signals supplied by the capacitive reading circuits 53a-53c and for supplying at the output corresponding digital signals. The sensing structure 2 is monolithic and integrated with the capacitive reading circuits 53a-53c in a die of semiconductor material.

The electronic apparatus 50 further comprises an electronic control unit 55, for example of a microprocessor type, connected to the sensor device 51 and designed to supervise general operation of the electronic apparatus 50, for example on the basis of the values of the detected magnetic field, and thus of the digital signals received by the analog-to-digital converter circuit 54.

Given the small size and low consumption of the MEMS triaxial magnetic sensor 1, advantageously, the sensor device 51 may possibly include further sensors, for example an accelerometer sensor and/or a triaxial gyroscope in order to obtain a complete integrated system for detection of acceleration, angular velocity, and magnetic field, according to the so-called "sensor fusion" mode.

Finally, it is clear that modifications and variations may be made to what has been described and illustrated herein, without thereby departing from the scope of the present disclosure.

For example, it is underlined that the particular conformation and configuration of the sensing structure 2 may vary with respect to what has been illustrated, for example envisaging a different arrangement of the elastic structures, or else the use of different materials (for example, monocrystalline silicon, instead of polycrystalline silicon for the mobile structure 10 and the electrode frame 20).

Furthermore, piezoelectric elements coupled to the mobile structure 10 and/or to the electrode frame 20 could be provided, for detecting the relative displacements following upon detection of the magnetic field, as an alternative, or in addition, to detection via capacitive variation.

The conductive path P may further be obtained by a stack of insulating layers 19' and conductive layers 19 arranged on top of one another in order to enhance further the characteristics of sensitivity and resolution.

Figure 7B:
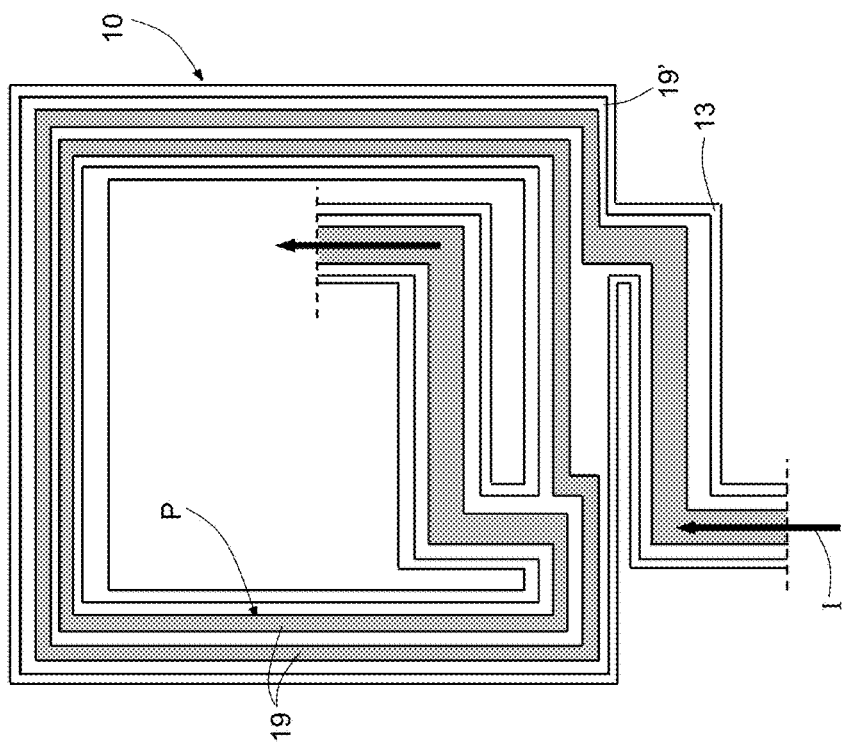
FIGS. 7A and 7B are schematic representations of possible variant embodiments of the conductive path in the sensing structure of the MEMS triaxial magnetic sensor.
Figure 7A:
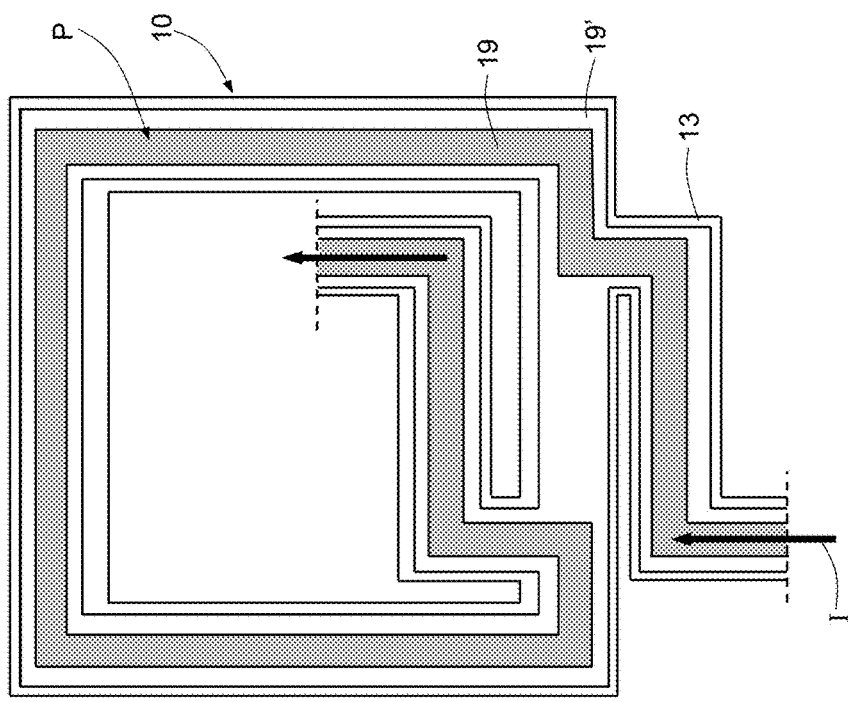

As a further alternative, as illustrated schematically in FIG. 7B (shown in combination with FIG. 7A, which represents, instead, once again in a schematic way, the solution described previously), the conductive path P on the insulating layer 19' could envisage, on each nested frame of the mobile structure 10, a number of nested loops (or turns), distinct from one another, before passing to the inner frame through the respective first coupling element 13 (so as to form as a whole the spiral path), in order to further enhance the sensing performance of the sensing structure 2.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS triaxial magnetic sensor device, comprising:
   a sensing structure that includes:
      a substrate;
      first anchorages fixed with respect to said substrate;
      first elastic elements;
      an outer frame internally defining a window and elastically coupled to the first anchorages by the first elastic elements;
      second elastic elements;
      a mobile structure, arranged in the window suspended above said substrate, elastically coupled to said outer frame by the second elastic elements, and providing a conductive path for flow of an electric current; and
      an elastic arrangement, within said window, operatively coupled to said mobile structure,
      wherein said mobile structure is configured to perform, due to said first and second elastic elements and said elastic arrangement:

a first sensing movement in response to Lorentz forces originating from a first magnetic-field component;
a second sensing movement in response to Lorentz forces originating from a second magnetic-field component; and
a third sensing movement in response to Lorentz forces originating from a third magnetic-field component, in the presence of said electric current in said conductive path; wherein said first, second, and third sensing movements are distinct and decoupled from one another.

2. The sensor device according to claim 1, wherein said sensing structure has a first axis of symmetry parallel to a first horizontal axis and a second axis of symmetry parallel to a second horizontal axis, said first and second horizontal axes defining a horizontal plane; wherein said first sensing movement is a movement of rotation of said mobile structure about said second axis of symmetry, fixedly with respect to said outer frame, and is defined by said first elastic elements; said second sensing movement is a movement of rotation of said mobile structure about said first axis of symmetry, decoupled from said outer frame, and is defined by said second elastic elements and said elastic arrangement; and said third sensing movement is a movement of translation in said horizontal plane and is defined by said elastic arrangement.

3. The device according to claim 1, wherein said first and second elastic elements are of a torsional type.

4. The sensor device according to claim 1, wherein said mobile structure is constituted by a set of nested frames, said sensing structure further comprises an electrode frame arranged internally with respect to an innermost frame of the nested frames of said mobile structure, and said elastic arrangement includes:
a first elastic structure coupled to the electrode frame, and
a second elastic structure coupling the mobile structure to the electrode frame.

5. The sensor device according to claim 4, further comprising:
second anchorages fixed with respect to said substrate, arranged internally with respect to said innermost frame of said mobile structure, and coupled to said first elastic structure; and
third elastic elements elastically coupling said mobile structure to the second anchorages.

6. The sensor device according to claim 4, wherein said electrode frame comprises a first half and a second half; and wherein said first elastic structure comprises an elastic coupling element of a tuning-fork type, configured to elastically couple said first and second halves to generate a corresponding movement in phase opposition in response to the Lorentz forces originating from the third magnetic-field component, said electrode frame being fixedly coupled to said mobile structure during said third movement.

7. The sensor device according to claim 6, wherein said elastic coupling element comprises a first half and a second half; and wherein said first elastic structure further comprises an elastic element that elastically couples together said first and second halves of said elastic coupling element, and a further elastic element that elastically couples said first and second halves of said elastic coupling element to said second anchorages.

8. The sensor device according to claim 4, wherein said second elastic structure comprises a lever element and a decoupling element; said lever element having a first portion and a second portion, having a linear extension; the first portion extending from an innermost frame of the mobile structure as far as a facing side of the decoupling element, and the second portion extending from said decoupling element as far as said electrode frame; wherein said second elastic structure is configured so that said electrode frame is decoupled from said mobile structure during said second sensing movement.

9. The sensor device according to claim 1, wherein said conductive path is defined by a conductive layer arranged on said mobile structure.

10. The sensor device according to claim 9, wherein said mobile structure includes:
a set of nested frames,
first coupling elements coupling the nested frames together in pairs at corresponding first facing sides, and
second coupling elements coupling the nested frames of the pairs together at corresponding second facing sides;
wherein said conductive layer extends as a spiral above said mobile structure, passing from an outermost frame of the nested frames to an innermost frame of the nested frames through a first half of said first coupling elements.

11. The sensor device according to claim 10, wherein said sensing structure comprises an insulating layer arranged between said mobile structure and said conductive layer.

12. The sensor device according to claim 11, wherein said conductive path includes two or more distinct loops, nested into one another, on each of said frames of said mobile structure.

13. The sensor device according to claim 10, wherein a second half of said first coupling elements and said second coupling elements defines, between said outermost frame and said innermost frame, a high-resistance path designed to oppose passage of said electric current.

14. The sensor device according to claim 1, wherein said mobile structure is constituted by a set of nested frames, and said sensing structure further comprises an electrode frame arranged internally with respect to an innermost frame of said mobile structure; the sensor device further comprising:
a first pair of sensing electrodes and a second pair of sensing electrodes, arranged on said substrate and underneath said mobile structure, capacitively coupled to said mobile structure to generate a differential capacitive variation following upon said first sensing movement and, respectively, said second sensing movement of said mobile structure; and
a third pair of sensing electrodes capacitively coupled to said electrode frame to generate a differential capacitive variation following upon said third sensing movement.

15. The sensor device according to claim 1, further comprising an electronic circuit, operatively coupled to said sensing structure to generate electrical sensing signals for detection of said first, second, and third magnetic-field components; wherein said sensing structure is monolithic and integrated with said electronic circuit in a die of semiconductor material.

16. An electronic apparatus, comprising:
a sensor device including a sensing structure that includes:
a substrate;
first anchorages fixed with respect to said substrate;
first elastic elements;
an outer frame internally defining a window and elastically coupled to the first anchorages by the first elastic elements;
second elastic elements;

a mobile structure, arranged in the window suspended above said substrate, elastically coupled to said outer frame by the second elastic elements, and providing a conductive path for flow of an electric current; and an elastic arrangement, within said window, operatively coupled to said mobile structure, wherein said mobile structure is configured to perform, due to said first and second elastic elements and said elastic arrangement:

a first sensing movement in response to Lorentz forces originating from a first magnetic-field component;

a second sensing movement in response to Lorentz forces originating from a second magnetic-field component; and a third sensing movement in response to Lorentz forces originating from a third magnetic-field component, in the presence of said electric current in said conductive path; wherein said first, second, and third sensing movements are distinct and decoupled from one another; and a control unit operatively coupled to the sensor device for receiving said electrical sensing signals.

17. The electronic apparatus according to claim 16, wherein said sensing structure has a first axis of symmetry parallel to a first horizontal axis and a second axis of symmetry parallel to a second horizontal axis, said first and second horizontal axes defining a horizontal plane; wherein said first sensing movement is a movement of rotation of said mobile structure about said second axis of symmetry, fixedly with respect to said outer frame, and is defined by said first elastic elements; said second sensing movement is a movement of rotation of said mobile structure about said first axis of symmetry, decoupled from said outer frame, and is defined by said second elastic elements and said elastic arrangement; and said third sensing movement is a movement of translation in said horizontal plane and is defined by said elastic arrangement.

18. The electronic apparatus according to claim 16, wherein said mobile structure is constituted by a set of nested frames, said sensing structure further comprises an electrode frame arranged internally with respect to an innermost frame of the nested frames of said mobile structure, and said elastic arrangement includes:

a first elastic structure coupled to the electrode frame, and a second elastic structure coupling the mobile structure to the electrode frame.

19. A sensing structure, comprising:

a substrate;

first anchorages fixed with respect to said substrate;

first elastic elements;

an outer frame internally defining a window and elastically coupled to the first anchorages by the first elastic elements;

second elastic elements;

a mobile structure, arranged in the window suspended above said substrate, elastically coupled to said outer frame by the second elastic elements, and providing a conductive path for flow of an electric current; and an elastic arrangement, within said window, operatively coupled to said mobile structure, wherein said mobile structure is configured to perform, due to said first and second elastic elements and said elastic arrangement:

a first sensing movement in response to Lorentz forces originating from a first magnetic-field component;

a second sensing movement in response to Lorentz forces originating from a second magnetic-field component; and a third sensing movement in response to Lorentz forces originating from a third magnetic-field component, in the presence of said electric current in said conductive path; wherein said first, second, and third sensing movements are distinct and decoupled from one another.

20. The sensing structure according to claim 19, wherein:

said conductive path is defined by a conductive layer arranged on said mobile structure; and said mobile structure includes:

a set of nested frames, first coupling elements coupling the nested frames together in pairs at corresponding first facing sides, and second coupling elements coupling the nested frames of the pairs together at corresponding second facing sides; wherein said conductive layer extends as a spiral above said mobile structure, passing from an outermost frame of the nested frames to an innermost frame of the nested frames through a first half of said first coupling elements.

21. The sensing structure according to claim 19, wherein said mobile structure is constituted by a set of nested frames, and said sensing structure further comprises an electrode frame arranged internally with respect to an innermost frame of said mobile structure; the sensing structure further comprising:

a first pair of sensing electrodes and a second pair of sensing electrodes, arranged on said substrate and underneath said mobile structure, capacitively coupled to said mobile structure to generate a differential capacitive variation following upon said first sensing movement and, respectively, said second sensing movement of said mobile structure; and a third pair of sensing electrodes capacitively coupled to said electrode frame to generate a differential capacitive variation following upon said third sensing movement.

* * * * *